(12) United States Patent
Mayo et al.

(10) Patent No.: US 9,822,267 B1
(45) Date of Patent: Nov. 21, 2017

(54) PHASE-CHANGE DIGITAL ADVANCED LITHOGRAPHIC IMAGING INK WITH POLYESTER TRANSFER ADDITIVE

(71) Applicant: XEROX CORPORATION, Norwalk, NY (US)

(72) Inventors: James D. Mayo, Mississauga (CA); Guerino G. Sacripante, Oakville (CA); Marcel P. Breton, Mississauga (CA); Aurelian Valeriu Magdalinis, Newmarket (CA); Jonathan Siu-Chung Lee, Oakville (CA); Mihaela Maria Birau, Hamilton (CA)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 15/262,871

(22) Filed: Sep. 12, 2016

(51) Int. Cl.
  *C09D 11/104* (2014.01)
  *G03F 7/00* (2006.01)
  *C09D 167/02* (2006.01)
  *B41F 7/24* (2006.01)

(52) U.S. Cl.
  CPC .............. *C09D 11/104* (2013.01); *B41F 7/24* (2013.01); *C09D 167/02* (2013.01); *G03F 7/0002* (2013.01)

(58) Field of Classification Search
  CPC .......... C09D 11/104; G03F 7/0002; B41F 7/24
  See application file for complete search history.

(56) References Cited

U.S. PATENT DOCUMENTS

| | | | |
|---|---|---|---|
| 2014/0368588 A1* | 12/2014 | Keoshkerian | C09D 11/34 347/88 |
| 2015/0197647 A1* | 7/2015 | Birau | C09D 11/101 522/181 |

* cited by examiner

*Primary Examiner* — Jennifer Simmons
*Assistant Examiner* — Michael Robinson
(74) *Attorney, Agent, or Firm* — Caesar Rivise, PC (57) ABSTRACT

An ink composition useful for digital offset printing applications includes a colorant and a high viscosity thickening agent. The ink is formulated to incorporate polyester viscosity modifier to help meet the requirement of two different viscosity or temperature pairs at two different stages of the process. In digital offset printing a bulk ink is first transferred onto an anilox roll, and then from the anilox roll onto the imaging cylinder blanket. During the bulk ink to anilox roll the disclosed ink has a low viscosity while the transfer from roll to imaging blanket the ink has a higher viscosity. The addition of the polyester viscosity modifier increases the viscosity difference within the allowable temperature range, thus, increasing process latitude and robustness.

4 Claims, 4 Drawing Sheets

CHEMICAL FORMULAS: $C_{128}H_{234}NaO_{10}$
MOLECULAR WEIGHT: 1969.25

PHASE-CHANGE DIGITAL ADVANCED LITHOGRAPHIC IMAGING INK WITH POLYESTER TRANSFER ADDITIVE

BACKGROUND OF THE INVENTION

Disclosed herein are radiation curable phase change ink compositions ideally suited for use in digital lithographic printing devices. In embodiments, the ink includes a polyester transfer additive. The ink vehicle may also contain additional curable components, and may also contain an initiator for curing upon exposure to radiation.

Ink-based digital printing uses a variable data lithography printing system, or digital offset printing system, or a digital advanced lithographic imaging system. A "variable data lithography system" is a system that is configured for lithographic printing using lithographic inks and based on digital image data, which may be variable from one image to the next. While "Variable data lithography printing," or "digital ink-based printing," or "digital offset printing," or digital advanced lithography imaging is printing of variable image data for producing images on a substrate that are changeable with each subsequent rendering of an image on the substrate in an image forming process.

For example, a digital offset printing process may include transferring radiation-curable ink onto a portion of a fluorosilicone-containing imaging member or printing plate that has been selectively coated with a dampening fluid layer according to variable image data. Regions of the dampening fluid are removed by exposure to a focused radiation source (e.g., a laser light source) to form pockets. A temporary pattern in the dampening fluid is thereby formed over the printing plate. Ink applied thereover is retained in the pockets formed by the removal of the dampening fluid. The inked surface is then brought into contact with a substrate and the ink transfers from the pockets in the dampening fluid layer to the substrate. The dampening fluid may then be removed, a new uniform layer of dampening fluid applied to the printing plate, and the process repeated. The ink is then transferred from the printing plate to a substrate such as paper, plastic, or metal on which an image is being printed and cured. The same portion of the imaging plate may be optionally cleaned depending on ink type and used to make a succeeding image that is different than the preceding image, based on the variable image data.

Digital offset printing inks differ from conventional inks because they must meet demanding rheological requirements imposed by the lithographic printing process while being compatible with system component materials and meeting the functional requirements of sub-system components, including wetting and transfer. Print process studies have demonstrated that higher viscosity is preferred for ink transfer to digital lithography imaging blanket from the inker unit via a roll and yet even higher viscosity is needed to improve transfer to a print substrate. Therefore, there remains a need for digital advanced lithography imaging inks to have increased viscosity latitude to enable excellent ink transfer from the ink loader system at both about 60° C. and excellent ink delivery from the anilox roller to the fluorosilicone blanket at temperatures as low as about 20° C.

BRIEF SUMMARY OF THE INVENTION

According to aspects of the embodiments, the present disclosure relates to certain ink compositions which are compatible with dampening fluids and are useful for variable data lithographic printing. The ink composition includes a colorant and a high viscosity thickening agent. A process for variable data lithographic printing includes applying a dampening fluid to an imaging member surface; forming a latent image by evaporating the dampening fluid from selective locations on the imaging member surface to form hydrophobic non-image areas and hydrophilic image areas; developing the latent image by applying an ink composition comprising an ink component to the hydrophilic image areas, the ink is formulated to incorporate polyester viscosity modifier into the digital advanced lithography imaging ink set to help meet the requirement of two different viscosity/temperature pairs at two different stages of the ink delivery process. In the digital advanced lithography architecture bulk ink is first transferred onto an anilox roll, and then from the anilox roll onto the imaging cylinder blanket. The first transfer from bulk ink to anilox roll requires the ink to have a low viscosity while the transfer from roll to imaging blanket requires a high viscosity. The addition of the polyester viscosity modifier increases the viscosity difference within the allowable temperature range, thus, increasing process latitude and robustness.

DETAILED DESCRIPTION OF THE INVENTION

Exemplary embodiments are intended to cover all alternatives, modifications, and equivalents as may be included within the spirit and scope of the composition, apparatus and systems as described herein.

A more complete understanding of the processes and apparatuses disclosed herein can be obtained by reference to the accompanying drawings. These figures are merely schematic representations based on convenience and the ease of demonstrating the existing art and/or the present development, and are, therefore, not intended to indicate relative size and dimensions of the assemblies or components thereof. In the drawing, like reference numerals are used throughout to designate similar or identical elements.

Example 1 includes an ink composition for variable data lithography printing comprising: an ink vehicle and at least one colorant component suspended in solution in the ink composition; the solution including at least one polyester viscosity modifier; and the solution comprising two or more of at least one dispersant; a thermal stabilizer; and a photo initiator system; wherein the at least one polyester viscosity modifier causes the ink composition for variable lithography printing to achieve a relative lower viscosity at a first temperature and a relative higher viscosity at a second temperature; wherein the first temperature is a heating temperature that is higher than the second temperature.

Example 2 includes Example and the solution further comprising: a rheology modifying agent.

Example 3 includes Example 2 and wherein the vehicle is a radiation-curable compound that comprises monomer compounds selected from the group of compounds comprising mono-, di-, and tri-functional acrylate monomers, tetra-functional acrylates and oligomers.

Example 4 includes Example 3 and wherein the least one polyester viscosity modifier is a crystalline polyester resin.

Example 5 includes Example 4 and wherein the at least one polyester viscosity modifier contains a crystalline polyester resin loading of from about 2 to about 4 weight percent (wt %) based on a total weight of the ink composition.

Example 6 includes Example 5 and wherein the crystalline polyester resin having a structure of formula I:

wherein M is a metal, and $R_1$ and $R_3$ is independently selected from the group consisting of aryl and alkyl; $R_2$ is independently selected from the group consisting of alkyl and oxyalkylene, and wherein a, b, c, n and p represent random segments of the polymer; and are each about 10 to about 100,000 units.

Example 7 includes Example 6 and wherein the second temperature is at a temperature range of about 15 to about 25° C.

Example 8 includes Example 1 and wherein the at least one polyester viscosity modifier is a non-curable polyester resin.

Example 9 includes Example 8 and wherein the photo initiator system comprising at least three or more photoinitiators being used at very specific ratios to each other.

Example 10 includes Example 9 and wherein at the first temperature the ink composition has shear rates corresponding to the equivalent angular frequencies from about 50 to about 200 rad/s and at the second temperature the ink composition has shear rates corresponding to the equivalent angular frequencies from about 0.5 to about 2 rad/s.

Example 11 includes a process for variable lithographic printing, comprising: applying a dampening fluid to an imaging member surface; forming a latent image by evaporating the dampening fluid from selective locations on the imaging member surface to form hydrophobic non-image areas and hydrophilic image areas; developing the latent image by applying an ink composition comprising an ink component that includes at least one polyester viscosity modifier to the hydrophilic image areas; and transferring the developed latent image to a receiving substrate; wherein the ink composition comprises an ink vehicle and at least one colorant component suspended in solution in the ink composition; and the solution comprising two or more of at least one dispersant; a thermal stabilizer; and a photo initiator system; wherein the at least one polyester viscosity modifier causes the ink composition for variable lithography printing to achieve a relative lower viscosity at a first temperature and a relative higher viscosity at a second temperature; wherein the first temperature is a heating temperature that is higher than the second temperature.

Example 12 includes Example 11 and wherein the crystalline polyester resin having a structure of formula I:

wherein M is a metal, and $R_1$ and $R_3$ is independently selected from the group consisting of aryl and alkyl; $R_2$ is independently selected from the group consisting of alkyl and oxyalkylene, and wherein a, b, c, n and p represent random segments of the polymer; and are each about 10 to about 100,000 units.

The modifier "about" used in connection with a quantity is inclusive of the stated value and has the meaning dictated by the context (for example, it includes at least the degree of error associated with the measurement of the particular quantity). When used with a specific value, it should also be considered as disclosing that value. For example, the term "about 2" also discloses the value "2" and the range "from about 2 to about 4" also discloses the range "from 2 to 4."

Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. For example, "a plurality of stations" may include two or more stations. The terms "first," "second," and the like, herein do not denote any order, quantity, or importance, but rather are used to distinguish one element from another. The terms "a" and "an" herein do not denote a limitation of quantity, but rather denote the presence of at least one of the referenced item.

The term "printing device" or "printing system" as used herein refers to a digital copier or printer, scanner, image printing machine, digital production press, document processing system, image reproduction machine, bookmaking machine, facsimile machine, multi-function machine, or the like and can include several marking engines, feed mechanism, scanning assembly as well as other print media processing units, such as paper feeders, finishers, and the like. A "printing system" can handle sheets, webs, marking materials, and the like. A printing system can place marks on any surface, and the like and is any machine that reads marks on input sheets; or any combination of such machines.

The term "print media" generally refers to a usually flexible, sometimes curled, physical sheet of paper, substrate, plastic, or other suitable physical print media substrate for images, whether precut or web fed.

The various embodiments disclose the concepts and formulations of radiation curable inks, such as radiation curable digital inks, such as digital advanced lithography imaging inks that incorporate a gellant. In digital advanced lithography imaging (FIG. 1) it is highly advantageous in order to ensure inking uniformity and ink delivery, see inker unit 140 at FIG. 1, that the ink have a relatively low viscosity at a first temperature. This first temperature can range from about 45 to about 80° C., such as from about 50 to about 70° C., such as from about 55 to about 65° C., such as about 60° C., and the ink at this first temperature having shear rates corresponding to the equivalent angular frequencies from about 50 to about 200 rad/s such as about 100 rad/s. It is also highly advantageous to ensure a high degree of ink transfer from the anilox roller to the blanket that the ink has relatively high viscosity within a second temperature that can range of about 18 to about 30° C., such as from about 18 to about 25° C., such as about 18° C., at shear rates corresponding to the equivalent angular frequencies from about 0.5 to about 2 rad/s such as about 1 rad/s.

Composition of comparative digital advanced lithography imaging ink comprises: acrylate oligomer, pigment, photoinitiator, acrylate monomer, dispersant, and additives. Digital advanced lithography imaging ink requirements necessitate low odor, low migration components appropriate according to safety considerations, and may be formulated to be appropriate for potential food contact (direct and indirect) applications.

The disclosed embodiments more specifically disclose the concept of inks comprising phase change additives, such as ETPA (ester-terminated polyamide) gelators, that can be formulated to achieve relatively lower viscosity at about 60° C. and relatively higher viscosity at about 18° C. In some embodiments, the target transfer rheology at high and low temperature is achieved in the narrowest temperature range that is from about 30° C. to about 60° C., such as from about 35° C. to about 50° C., such as from about 40° C. to about 42° C.

Figure 2:
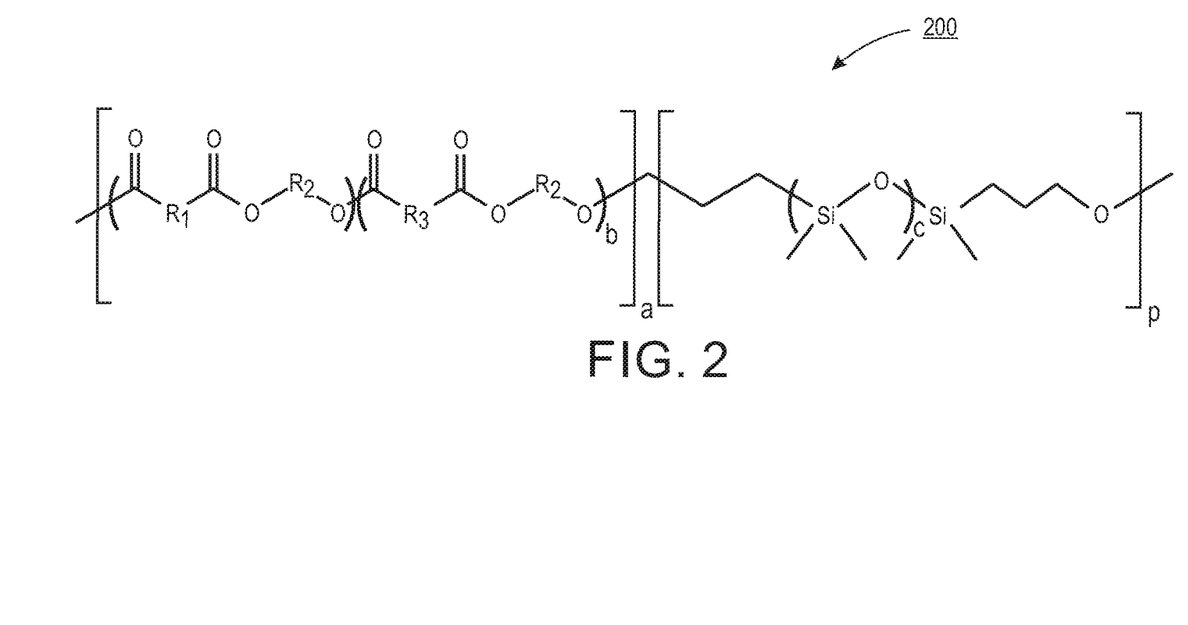
FIG. 2 illustrates the chemical Structure polyester viscosity modifier in accordance to an embodiment.
Figure 3:
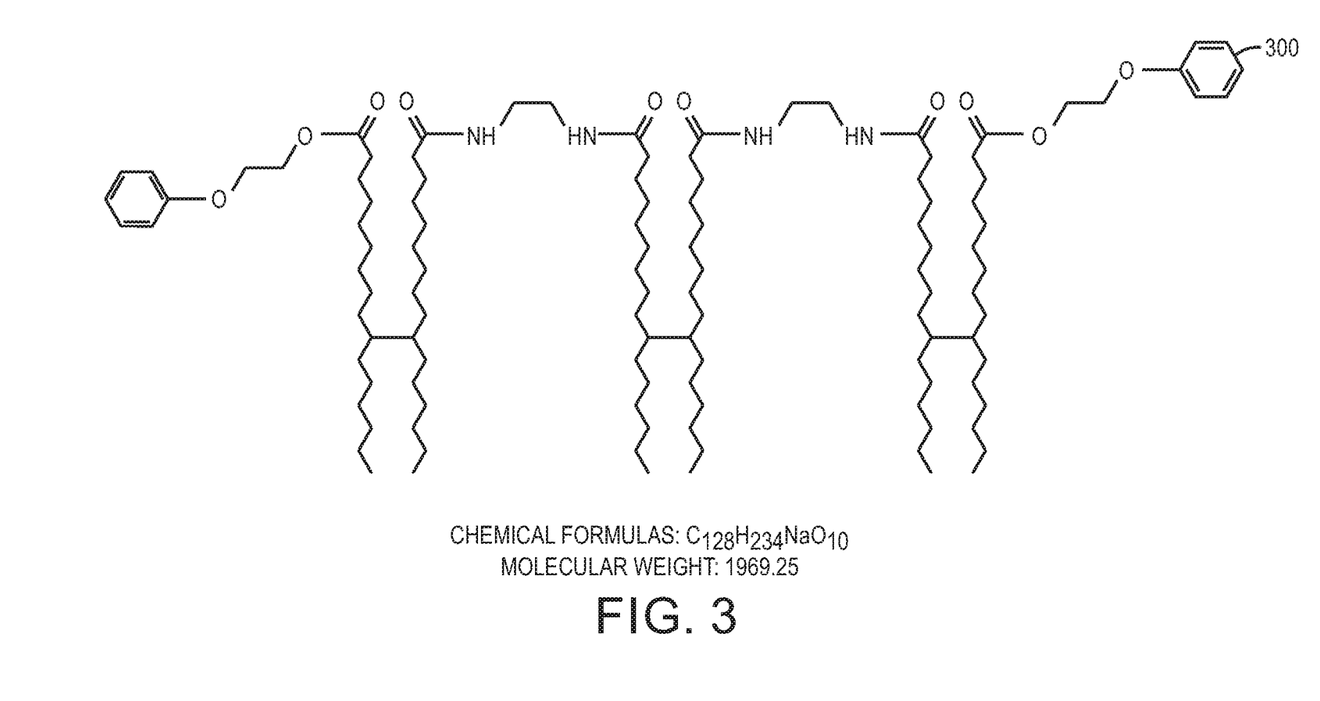
FIG. 3 illustrates the chemical Structure for an ester-terminated polyamide (ETPA) gelator with an average of hydrophobic three (3) dimer tails in accordance to an embodiment.

Examples of such ETPA gelators are in FIGS. 2 and 3, whose chemical structures are highlighted.

Figure 1:
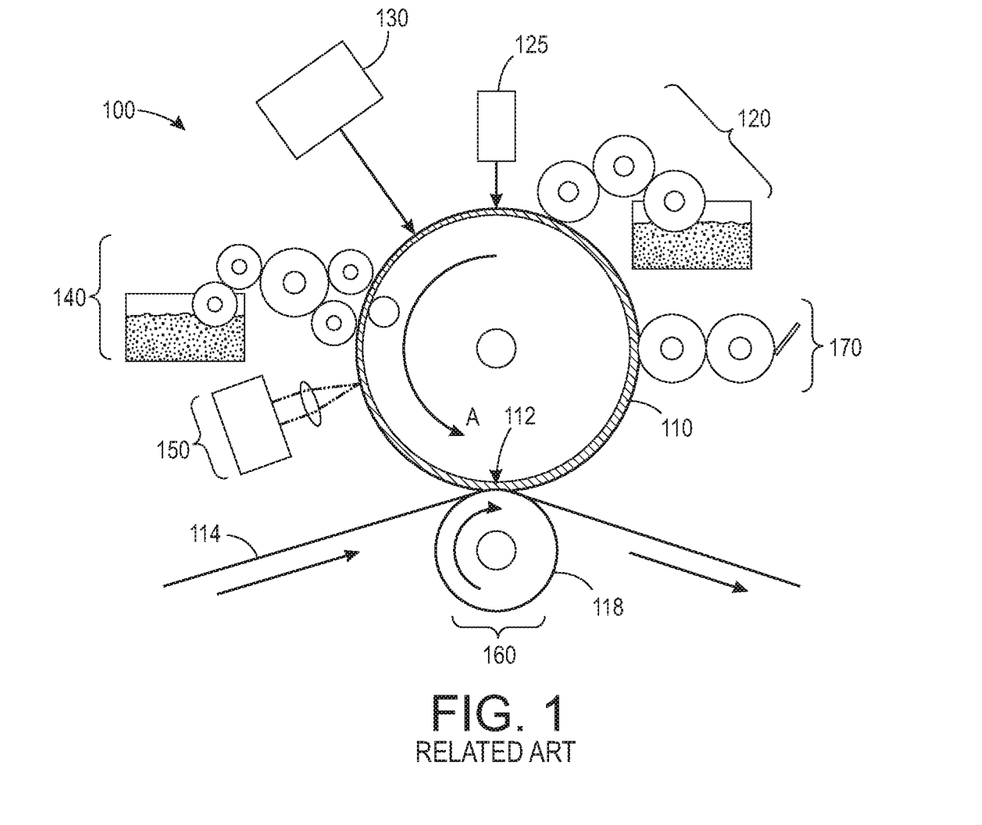
FIG. 1 illustrates a block diagram of a system that shows a related art ink-based digital printing system in which the ink compositions of the present disclosure may be used.

As shown in FIG. 1, the exemplary system 100 may include an imaging member 110. System 100 illustrates a system for variable lithography in which the ink compositions of the present disclosure may be used. The imaging member 110 in the embodiment shown in FIG. 1 is a drum, but this exemplary depiction should not be interpreted so as to exclude embodiments wherein the imaging member 110 includes a drum, plate or a belt, or another now known or later developed configuration. The reimageable surface may be formed of materials including, for example, a class of materials commonly referred to as silicones, including polydimethylsiloxane (PDMS), among others. For example, silicone, fluorosilicone, and/or VITON® may be used. The reimageable surface may be formed of a relatively thin layer over a mounting layer, a thickness of the relatively thin layer being selected to balance printing or marking performance, durability and manufacturability.

The imaging member 110 is used to apply an ink image to an image receiving media substrate 114 at a transfer nip 112. The transfer nip 112 is formed by an impression roller 118, as part of an image transfer mechanism 160, exerting pressure in the direction of the imaging member 110. Image receiving medium substrate 114 should not be considered to be limited to any particular composition such as, for example, paper, plastic, or composite sheet film. The exemplary system 100 may be used for producing images on a wide variety of image receiving media substrates. There is wide latitude of marking (printing) materials that may be used, including marking materials with pigment loading greater than 10% by weight. This disclosure will use the term ink to refer to a broad range of printing or marking materials to include those which are commonly understood to be inks, pigments, and other materials which may be applied by the exemplary system 100 to produce an output image on the image receiving media substrate 114.

The imaging member 110 including the imaging member 110 being comprised of a reimageable surface layer formed over a structural mounting layer that may be, for example, a cylindrical core, or one or more structural layers over a cylindrical core.

The exemplary system 100 includes a dampening fluid system 120 generally comprising a series of rollers, which may be considered as dampening rollers or a dampening unit, for uniformly wetting the reimageable surface of the imaging member 110 with dampening fluid. A purpose of the dampening fluid system 120 is to deliver a layer of dampening fluid, generally having a uniform and controlled thickness, to the reimageable surface of the imaging member 110. As indicated above, it is known that a dampening fluid such as fountain solution may comprise mainly water optionally with small amounts of isopropyl alcohol or ethanol added to reduce surface tension as well as to lower evaporation energy necessary to support subsequent laser patterning, as will be described in greater detail below. Small amounts of certain surfactants may be added to the fountain solution as well. Alternatively, other suitable dampening fluids may be used to enhance the performance of ink based digital lithography systems. Exemplary dampening fluids include water, NOVEC® 7600 (1,1,1,2,3,3-Hexafluoro-4-(1,1,2,3,3,3-hexafluoropropoxy)pentane and has CAS#870778-34-0.), and D4 (octamethylcyclotetrasiloxane).

Once the dampening fluid is metered onto the reimageable surface of the imaging member 110, a thickness of the dampening fluid may be measured using a sensor 125 that may provide feedback to control the metering of the dampening fluid onto the reimageable surface of the imaging member 110 by the dampening fluid system 120.

After a precise and uniform amount of dampening fluid is provided by the dampening fluid system 120 on the reimageable surface of the imaging member 110, and optical patterning subsystem 130 may be used to selectively form a latent image in the uniform dampening fluid layer by imagewise patterning the dampening fluid layer using, for example, laser energy. Typically, the dampening fluid will not absorb the optical energy (IR or visible) efficiently. The reimageable surface of the imaging member 110 should ideally absorb most of the laser energy (visible or invisible such as IR) emitted from the optical patterning subsystem 130 close to the surface to minimize energy wasted in heating the dampening fluid and to minimize lateral spreading of heat in order to maintain a high spatial resolution capability. Alternatively, an appropriate radiation sensitive component may be added to the dampening fluid to aid in the absorption of the incident radiant laser energy. While the optical patterning subsystem 130 is described above as being a laser emitter, it should be understood that a variety of different systems may be used to deliver the optical energy to pattern the dampening fluid.

The mechanics at work in the patterning process undertaken by the optical patterning subsystem 130 of the exemplary system 100 are known to those in the art. Briefly, the application of optical patterning energy from the optical patterning subsystem 130 results in selective removal of portions of the layer of dampening fluid.

Following patterning of the dampening fluid layer by the optical patterning subsystem 130, the patterned layer over the reimageable surface of the imaging member 110 is presented to an inker subsystem 140. The inker subsystem 140 is used to apply a uniform layer of ink over the layer of dampening fluid and the reimageable surface layer of the imaging member 110. The inker unit 140 further comprises heated ink baths whose temperatures are regulated by temperature control module. The inker subsystem 140 may use an anilox roller to meter an offset lithographic ink onto one or more ink forming rollers that are in contact with the reimageable surface layer of the imaging member 110. Separately, the inker subsystem 140 may include other traditional elements such as a series of metering rollers to provide a precise feed rate of ink to the reimageable surface. The inker subsystem 140 may deposit the ink to the pockets representing the imaged portions of the reimageable surface, while ink on the unformatted portions of the dampening fluid will not adhere to those portions.

The cohesiveness and viscosity of the ink residing in the reimageable layer of the imaging member 110 may be modified by a number of mechanisms. One such mechanism may involve the use of a rheology (complex viscoelastic modulus) control subsystem 150. The rheology control system 150 may form a partial crosslinking core of the ink on the reimageable surface to, for example, increase ink cohesive strength relative to the reimageable surface layer. Curing mechanisms may include optical or photo curing, heat curing, drying, or various forms of chemical curing. Cooling may be used to modify rheology as well via multiple physical cooling mechanisms, as well as via chemical cooling.

The ink is then transferred from the reimageable surface of the imaging member 110 to a substrate of image receiving medium 114 using a transfer subsystem 160. The transfer occurs as the substrate 114 is passed through a nip 112 between the imaging member 110 and an impression roller 118 such that the ink within the voids of the reimageable surface of the imaging member 110 is brought into physical contact with the substrate 114. With the adhesion of the ink having been modified by the rheology control system 150, modified adhesion of the ink causes the ink to adhere to the substrate 114 and to separate from the reimageable surface of the imaging member 110. Careful control of the temperature and pressure conditions at the transfer nip 112 may allow transfer efficiencies for the ink from the reimageable surface of the imaging member 110 to the substrate 114 to exceed 95%. While it is possible that some dampening fluid may also wet substrate 114, the volume of such a dampening fluid will be minimal, and will rapidly evaporate or be absorbed by the substrate 114.

In certain offset lithographic systems, it should be recognized that an offset roller, not shown in FIG. 1, may first receive the ink image pattern and then transfer the ink image pattern to a substrate according to a known indirect transfer method. Following the transfer of the majority of the ink to the substrate 114, any residual ink and/or residual dampening fluid must be removed from the reimageable surface of the imaging member 110, preferably without scraping or wearing that surface. An air knife may be employed to remove residual dampening fluid. It is anticipated, however, that some amount of ink residue may remain. Removal of such remaining ink residue may be accomplished through use of some form of cleaning subsystem 170. The cleaning subsystem 170 comprises at least a first cleaning member such as a sticky or tacky member in physical contact with the reimageable surface of the imaging member 110, the sticky or tacky member removing residual ink and any remaining small amounts of surfactant compounds from the dampening fluid of the reimageable surface of the imaging member 110. The sticky or tacky member may then be brought into contact with a smooth roller to which residual ink may be transferred from the sticky or tacky member, the ink being subsequently stripped from the smooth roller by, for example, and a doctor blade.

Other mechanisms by which cleaning of the reimageable surface of the imaging member 110 may be facilitated. Regardless of the cleaning mechanism, however, cleaning of the residual ink and dampening fluid from the reimageable surface of the imaging member 110 is essential to preventing ghosting in the proposed system. Once cleaned, the reimageable surface of the imaging member 110 is again presented to the dampening fluid system 120 by which a fresh layer of dampening fluid is supplied to the reimageable surface of the imaging member 110, and the process is repeated.

As discussed above, digital offset ink must possess physical and chemical properties that are specific to ink-based digital printing systems. The ink must be compatible with materials that it comes in contact with, including the imaging plate and dampening fluid, and printable substrates such as paper, metal, or plastic. The ink must also meet all functional requirements of the subsystems including wetting and transfer properties defined by subsystem architecture and material sets.

Inks formulated for ink-based digital printing, or digital offset inks, are different in many ways from other inks developed for printing applications, including pigmented solvents, UV gel inks, and other inks. For example, digital offset inks contain much higher pigment and therefore have higher viscosity at room temperature than other inks, which can make ink delivery by way of an anilox roll or inkjet system difficult. Digital offset inks must meet certain wetting and release property requirements imposed by the imaging member used for ink-based digital printing processes, while being compatible with non-aqueous dampening fluid options. Digital offset ink should not cause the imaging member surface to swell. Water-dilutable and water-diluted inks in accordance with embodiments include digital offset acrylate inks meeting such requirements.

Digital offset inks in accordance with water-dilutable ink embodiments advantageously have a much lower solubility in dampening fluid such as D4 than related art inks. Also, digital offset inks of embodiments do not tend to swell a silicone-containing imaging member surface layer used in ink-based digital printing systems such as that shown in FIG. 1, which may be a silicone, fluorosilicone, or VITON-containing imaging plate or blanket.

The ink must be compatible with materials it is in contact with, including printing plate 110, fountain solution applied by dampening fluid system 120, and other cured or non-cured inks. It must also meet all functional requirements of the sub-systems, including wetting and transfer properties. Transfer of the imaged inks is challenging, as the ink must at once wet the blanket material homogeneously (plate 110), and transfer from the blanket to the substrate (112, 114, and 118). Transfer of the image layer must be very efficient, at least as high as 90%, as the cleaning sub-station can only eliminate small amounts of residual ink. Any ink remaining on the blanket after cleaning would result in an unacceptable ghost image appearing in subsequent prints. Not surprisingly, ink rheology plays a key role in the transfer characteristics of an ink.

The inks described herein may include the following components: (a) radiation-curable water-dilutable monomer compounds, including mono-, di-, and tri-functional water-dilutable acrylate monomers, oligomers; (b) dispersants; (c) pigments; (d) clays or additives; (e) initiators; (f) additional curable compounds including monomers, oligomers, including oligomers from Sartomer USA, LLC or Cytec Industries, Inc., prepolymers, polymers; (g) additives including surfactants, free-radical scavengers, and the like; (h) thermal stabilizers.

The water-diluted curable components may include any water-dilutable acrylate or methacrylate monomer compound(s) suitable for use as a phase change ink carrier or ink vehicle that may be water dilutable, with an addition of water being available to adjust and/or enhance background performance for use in the variable digital data lithographic printing architecture. In embodiments, the water-diluted curable component is a water-dilutable functional acrylate monomer, a methacrylate monomer, a multifunctional acrylate monomer, a multifunctional methacrylate monomer, or a mixture or combination thereof. Exemplary acrylates may include acrylate monomers or polymers such as polyester acrylates Sartomer CN294E, Sartomer CD-501, Sartomer CN9014, Sartomer CN2282 and Sartomer CN2256. In embodiments, a mixture of the components is water-dilutable.

Examples of curable monomers and diluting acrylates which can be used in the ink compositions as vehicles may include Trimethylolpropane triacrylate; SR-492, SR-501, SR-444, SR-454, SR-499, SR-502, SR-9035 and SR-415 from Sartomer; EBECRYL 853 and EBECRYL 5500 from Allnex. Trimethylolpropane triacrylate has a refractive index of 1.474, a specific gravity of 1.06 g/cm$^3$, an APHA Color of less than 300 and a viscosity range of 80 to 120 cps at 25° C. Sartomer SR-492 is a three mole propoxylated trimethylolpropane triacrylate and has a refractive index of 1.459, a specific gravity of 1.05 g/cm$^3$, a Tg of −15° C., an APHA Color of 30 and a viscosity of 90 cps at 25° C. Sartomer SR-501 is a six mole propoxylated trimethylolpropane triacrylate and has a refractive index of 1.4567, a specific gravity of 1.048 g/cm$^3$, a Tg of −2° C., an APHA Color of 90 and a viscosity of 125 cps at 25° C. Sartomer SR-444 is a pentaerythritol triacrylate and has a refractive index of 1.4801, a specific gravity of 1.162 g/cm$^3$, a Tg of 103° C., an APHA Color of 50 and a viscosity of 520 cps at 25° C. Sartomer SR-454 is a three mole ethoxylated trimethylolpropane triacrylate and has a refractive index of 1.4689, a specific gravity of 1.103 g/cm$^3$, a Tg of 120° C., an APHA Color of 55 and a viscosity of 60 cps at 25° C. Sartomer SR-499 is a six mole ethoxylated trimethylolpropane triacrylate and has a refractive index of 1.4691, a specific gravity of 1.106 g/cm$^3$, a Tg of −8° C., an APHA Color of 50 and a viscosity of 85 cps at 25° C. Sartomer SR-502 is a nine mole ethoxylated trimethylolpropane triacrylate and has a refractive index of 1.4691, a specific gravity of 1.11 g/cm$^3$, a Tg of −19° C., an APHA Color of 140 and a viscosity of 130 cps at 25° C. Sartomer SR-9035 is a fifteen mole ethoxylated trimethylolpropane triacrylate and has a refractive index of 1.4695, a specific gravity of 1.113 g/cm$^3$, a Tg of −32° C., an APHA Color of 60 and a viscosity of 168 cps at 25° C. Sartomer SR-415 is a twenty mole ethoxylated trimethylolpropane triacrylate and has a refractive index of 1.4699, a specific gravity of 1.115 g/cm$^3$, a Tg of −40° C., an APHA Color of 55 and a viscosity of 225 cps at 25° C. EBECRYL 853 is a low viscosity polyester triacrylate and has a specific gravity of 1.10 g/cm$^3$, an APHA Color of 200 and a viscosity of 80 cps at 25° C. EBECRYL 5500 is a low viscosity glycerol derivative triacrylate and has a specific gravity of 1.07 g/cm$^3$, an APHA Color of 62 and a viscosity of 130 cps at 25° C. Other triacrylate, monoacrylate, diacrylate, tetraacrylate and higher functional acrylate monomers, diluting acrylates, and various combinations thereof, can also be used in the ink compositions as vehicles.

One or more components in a mixture may be non-water dilutable, if the ink is water dilutable, and the reactive component are themselves miscible. In the same way that water may be added, in some embodiments, co-reactive monomers may be added to control polarity of the ink. Specific examples of water-dilutable curable components include, but are not limited to, the functional water soluble aromatic urethane acrylate compound (available from CYTEC as EBECRYL 2003), the di-functional compound polyethylene glycol diacrylate (available from CYTEC as EBECRYL 11), and the tri-functional compound polyether triacrylate (available from CYTEC as EBECRYL 12). The monomer or oligomer can be present in any suitable amount. In embodiments, the monomer or oligomer, or combination thereof is added in an amount of from about 10 to about 85%, or from about 30 to about 80%, or from about 50 to about 70%, by weight based on the total weight of the curable ink composition. Curable oligomers which can be used in the ink compositions as vehicles may include Sartomer CN294E; CN2256; CN2282; CN9014 and CN309. Sartomer CN294E is a tetrafunctional acrylated polyester oligomer. CN294E is a clear liquid having a specific gravity of 0.93 and a viscosity of 4,000 cps at 60° C. Sartomer CN2256 is a difunctional polyester acrylate oligomer and has a refractive index of 1.5062, a Tg of −22° C., a tensile strength of 675 psi, and a viscosity of 11,000 cps at 60° C. Sartomer CN2282 is tetrafunctional acrylated polyester and is a clear liquid having a specific gravity of 1.15 and a viscosity of 2,500 cps at 60° C. Sartomer CN9014 is a difunctional acrylated urethane and is a non-clear liquid having a specific gravity of 0.93 and a viscosity of 19,000 cps at 60° C. Sartomer CN309 is an oligomer containing an acrylate ester that derives from an aliphatic hydrophobic backbone, or in other words is an aliphatic acrylate ester. CN309 is a clear liquid having a specific gravity of 0.92, a density of 7.68 pounds/gallon, a surface tension of 26.3 dynes/cm, a viscosity of 150 cps at 25° C., and a viscosity of 40 cps at 60° C.

Examples of curable oligomers which can be used in the ink compositions as vehicles may include CN294E, CN2256, CN2282, CN9014 and CN309 from Sartomer; EBECRYL 8405, EBECRYL 8411, EBECRYL 8413, EBECRYL 8465, EBECRYL 8701, EBECRYL 9260, EBECRYL 546, EBECRYL 657, EBECRYL 809, and the like from Allnex. EBECRYL 8405 is a tetrafunctional urethane acrylate diluted as 80 wt % by weight in 1,6-Hexanediol diacrylate (HDDA). EBECRYL 8405 is a clear liquid having a Gardner Color of 2 and a viscosity of 4,000 cps at 60° C. EBECRYL 8411 is a difunctional urethane acrylate diluted as 80 wt % by weight in isobornylacrylate (IBOA). EBECRYL 8411 is a clear liquid having a viscosity range of 3,400 to 9,500 cps at 65° C. EBECRYL 8413 is a difunctional urethane acrylate diluted as 67 wt % by weight in IBOA. EBECRYL 8413 is a clear liquid having a viscosity of 35,000 cps at 60° C. EBECRYL 8465 is a trifunctional urethane acrylate. EBECRYL 8465 is a clear liquid having a Gardner Color of 2 and a viscosity of 21,000 cps at 60° C. EBECRYL 8701 is a trifunctional urethane acrylate. EBECRYL 8701 is a clear liquid having a Gardner Color of 2 and a viscosity of 4,500 cps at 60° C. EBECRYL 9260 is a trifunctional urethane acrylate. EBECRYL 9260 is a clear liquid having a Gardner Color of 2 and a viscosity of 4,000 cps at 60° C. EBECRYL 546 is a trifunctional polyester acrylate. EBECRYL 546 is a clear liquid having a Gardner Color of 1.5 and a viscosity of 350,000 cps at 25° C. EBECRYL 657 is a tetrafunctional polyester acrylate. EBECRYL 657 is a clear liquid having a Gardner Color of 4 and a viscosity of 125,000 cps at 25° C. EBECRYL 809 is a trifunctional polyester acrylate. EBECRYL 809 is a clear liquid having a Gardner Color of 3 and a viscosity of 1,300 cps at 60° C.

The dispersant components may include any suitable or desired dispersant including, but not limited to AB-diblock copolymers of high molecular weight such as EFKA® 4340 available from BASF SE, and DISPERBYK® 2100 available from Byk-Chemie GmbH, or a mixture thereof. In a specific embodiment, the dispersant mixture comprises a cyclohexane dimethanol diacrylate (such as CD406® available from Sartomer USA, LLC) and at least one additional component, such as EFKA® 4340 is a high molecular weight dispersing agent having an AB-diblock copolymer structure available from BASF SE. In an exemplary embodiment, the dispersant is a polymeric dispersant, such as SOLSPERSE® 39000, commercially available from The Lubrizol Corporation. The dispersant may be added in an amount within the range of from about 20% to about 100% by weight, based on the weight of the composition. Dispersant may be added in an amount that is determined based on the amount of pigment used.

The disclosed curable ink composition also includes a colorant or pigment component, which may be any desired or effective colorant may be employed, including pigments, mixtures of pigments, mixtures of pigments and dyes, and the like, provided that the colorant may be dissolved or dispersed in the at least one monomer and at least one dispersant. In specific embodiments, the colorant is a pigment. Examples of suitable pigments include PALIOGEN Violet 5100 (BASF); PALIOGEN Violet 5890 (BASF); HELIOGEN Green L8730 (BASF); LITHOL Scarlet D3700 (BASF); SUNFAST. Blue 15:4 (Sun Chemical); Hostaperm Blue B2G-D (Clariant); Permanent Red P-F7RK; HOSTAPERM Violet BL (Clariant); LITHOL Scarlet 4440 (BASF); Bon Red C (Dominion Color Company); ORACET Pink RF (Ciba); PALIOGEN Red 3871 K (BASF); SUNFAST Blue 15:3 (Sun Chemical); PALIOGEN Red 3340 (BASF); SUNFAST Carbazole Violet 23 (Sun Chemical); LITHOL Fast Scarlet L4300 (BASF); SUNBRITE Yellow 17 (Sun Chemical); HELIOGEN Blue L6900, L7020 (BASF); SUNBRITE Yellow 74 (Sun Chemical); SPECTRA PAC C Orange 16 (Sun Chemical); HELIOGEN Blue K6902, K6910 (BASF); SUNFAST® Magenta 122 (Sun Chemical); HELIOGEN Blue D6840, D7080 (BASF); Sudan Blue OS (BASF); NEOPEN Blue FF4012 (BASF); PV Fast Blue B2GO1 (Clariant); IRGALITE Blue BCA (Ciba); PALIOGEN Blue 6470 (BASF); Sudan Orange G (Aldrich), Sudan Orange 220 (BASF); PALIOGEN Orange 3040 (BASF); PALIOGEN Yellow 152, 1560 (BASF); LITHOL Fast Yellow 0991 K (BASF); PALIOTOL Yellow 1840 (BASF); NOVOPERM Yellow FGL (Clariant); Lumogen Yellow D0790 (BASF); Suco-Yellow L1250 (BASF); Suco-Yellow D1355 (BASF); Suco Fast Yellow D1355, D1351 (BASF); HOSTAPERM Pink E 02 (Clariant); Hansa Brilliant Yellow 5GX03 (Clariant); Permanent Yellow GRL 02 (Clariant); Permanent Rubine L6B 05 (Clariant); FANAL Pink D4830 (BASF); CINQUASIA Magenta (DuPont); PALIOGEN Black L0084 (BASF); Pigment Black K801 (BASF); and carbon blacks such as REGAL 330® (Cabot), Carbon Black 5250, Carbon Black 5750 (Columbia Chemical), and the like, as well as mixtures thereof.

The disclosed curable ink composition also includes a thermal stabilizer (h), an exemplary thermal stabilizer is Sartomer CN3216, which is an acrylate stabilizing additive having a specific gravity of 1.113 at 25° C. and a viscosity of 1,100 cps at 25° C. Another exemplary thermal stabilizer is IRGASTAB UV 10, available from Ciba Specialty Chemicals, which acts as a radical scavenger. Both aforementioned radical scavengers, among others, promote in-can stability of the ink as it is stored at room temperature over time and prevent partial thermal curing of UV curable components while they are being processed at elevated temperatures with a pigment and other components to form a radiation curable ink The disclosed curable ink composition also includes a mixture of clay and CN2256 to achieve optimum rheological or image transfer characteristics.

In an exemplary embodiment, a digital offset ink composition may include a cyan pigment, BASF HELIOGEN Blue D 7088, originally available as IRGALITE Blue GLO from Ciba. The amount of colorant or pigment added to the ink composition may be within the range of from about 10% to about 30% by weight of the composition, or from about 19% to about 25%, or from about 20% or more, up to about 30%, based on the total weight of the ink composition.

In some embodiments, the acrylate ink compositions may include rheology modifiers. Exemplary rheology modifiers may be modified or unmodified inorganic compounds including organoclays, attapulgite clays and bentonite clays, including tetraalkyl ammonium bentonites as well as treated and untreated synthetic silicas. Suitable organoclays include from Southern Clay Products CLAYTONE HA and CLAYTONE HY. Suitable examples of tetraallkyl ammonium bentonites include from Celeritas Chemicals CELCHEM 31743-09, CELCHEM 31744-09, and CELCHEM 31745-

09. Other exemplary rheology modifiers include organic compounds such as EFKA RM1900 and EFKA RM1920, both modified hydrogenated castor oils from BASF. The colorant may be added together with a clay (d) component. In an embodiment, the clay is CLAYTONE® HY from Southern Clay Products. In an embodiment the clay component may be replaced with a silica, e.g.: AEROSIL 200 available from Degussa Canada, Ltd, and is added in an amount within the range of from about 1% to about 5% by weight, or from about 1.4% to about 3.5% by weight, or from about 1.8% to 2.0% by weight, based on the total weight of the composition.

Digital offset ink compositions of embodiments include initiator systems, which may include a photoinitiator that initiates polymerization of curable components of the ink, including the curable monomer. In an embodiment, the initiator is an ultraviolet radiation-activated photoinitiator. Exemplary photoinitiators include IRGACURE 379, IRGACURE 184 and IRGACURE 819, both available from Ciba Specialty Chemicals. IRGACURE 379 is 2-dimethylamino-2-(4-methyl-benzyl)-1-(4-morpholino-4-yl-phenyl)-butan-1-one, with a molecular weight of 380.5. IRGACURE 184 is 1-hydroxy-cyclohexyl-phenyl-ketone, having a molecular weight of 204.3. IRGACURE 819 is bis(2,4,6-trimethylbenzoyl)-phenylphosphine oxide, having a molecular weight of 418.5. Another exemplary photoinitiator is Esacure KIP 150, available from Lamberti Technologies, which is an oligomeric alpha hydroxyketone, oligo[2-hydroxy-2-methyl-1-[4-(1-methylvinyl)phenyl]propanone]. The photoinitiator(s) may be present in an amount of from 0 to about 10 wt % of the ink composition, including from about 5 to about 8 wt %. In some embodiments, the (meth)acrylate ink compositions may include photoinitiators. Photoinitiators may be liquid- or solid-based or combinations thereof. Suitable Type I photoinitiators include those from classes of dialkoxy-acetopheonones, dialkoxy-alkyl-pheonones, amino-alkyl-pheonones, and acyl-phosphine oxides. Suitable Type II photoinitiators include those from classes of benzophenones and thioxanthones, which require activation from suitable amine synergists. Exemplary photoinitiators include ADDITOL LX, ADDITOL DX, ADDITOL BDK, ADDITOL CPK, ADDITOL DMMTA, ADDITOL TPO from Allnex, Esacure 1001M from IRGACURE 127, IRGACURE 184, IRGACURE 379, IRGACURE 819 and IRGACURE 2959 from BASF. Exemplary amine synergists that are used with Type II photoinitiators include SPEEDCURE PDA, SPEEDCURE EDB from Lambson, Diethylaminoethyl Methacrylate, Ethyl-4-dimethylamino benzoate, 2-Ethylhexyl 4-dimethylamino benzoate from Esstech, Inc. In some embodiment, the (meth)acrylate ink composition may include low odor photoinitiators, such as, ESACURE KIP 150 available from Lamberti S.p.A.

The disclosed ink with the improved viscosity range fulfills the need in the art for an ink having relatively low viscosity within a temperature range of about 45 to about 80° C. (first temperature), such as at about 60° C., at shear rates corresponding to the equivalent angular frequencies from about 50 to about 200 rad/s, such as at about 100 rad/s. Further the disclosed ink fulfills the need in the art for a high degree of ink transfer from the anilox roller to the blanket. This can be achieved using an ink having relatively high viscosity within a temperature range of about 15 to about 25° C. (second temperature), such as at about 20° C., at shear rates corresponding to the equivalent angular frequencies from about 0.5 to about 2 rad/s, such as at about 1 rad/s. Thus, the embodiments meet the ideal digital lithography imaging ink requirements of at once having relatively low viscosity at the inking temperature, about 60° C., and relatively high viscosity at the transfer temperature, about 20° C., i.e., when the inked image is transferred to the print substrate.

In embodiments, the ink with the phase change additives is obtained by using polyester viscosity modifiers such as illustrated in FIG. 2 as produced by the process described below in ink Example 1 and ink Example 2.

These inks were prepared by process familiar to those in the art. Exemplary formulations comprise components such as Tetrafunctional polyester acrylate oligomer; Propoxylated trimethylolpropane triacrylate monomer; Optional additional wholly compatible higher functionality monomers (n=4, 5, 6, etc.); Example pigments: C.I. Pigment Blue 15:3 (cyan), C.I. Pigment Red 57:1 (magenta), C.I. Pigment Yellows 12,14, C.I. Pigment Black 7 examples, Mogul E, Nipex 35, Nipex 150; Free-radical photoinitiators: single or mixed systems having three or more photoinitiators; Organoclay or silica fillers such as CLAYTONE HA and CLAYTONE HY; Thermal and in-can stabilizers; and, a new component polyester viscosity modifiers such as the modifier illustrated in FIG. 2.

The embodiments disclose the concept of polyester viscosity modifiers that can be formulated to achieve relatively low viscosity at a first temperature like 60° C. and relatively high viscosity at second temperature like 20° C.

FIG. 2 illustrates the chemical Structure polyester viscosity modifier (Formula I) in accordance to an embodiment. Formula I is manufactured into a crystalline polyester resin for mixture with other components which comprises the ink set. Formula I is structurally represented as follows:

wherein M is a hydrogen or alkali metal such as lithium or sodium, and $R_1$ and $R_3$ is independently selected from the group consisting of aryl and alkyl; $R_2$ is independently selected from the group consisting of alkyl and oxyalkylene, and wherein a, b, c, n and p represent random segments of the polymer; and are each about 10 to about 100,000 units.

A general synthesis of a crystalline polyester (CPE) sample using a polyester resin taken from Table I (below) like GS-HK-12 (CPE 6:4) can be produced by: Adding a resin with 646 grams (g) of adipic acid, 397 g of butane-diol and 2 g of Fascat 4100 to a 2-LBuchi Reactor. The mixture is then heated to 210° C. over a 6 hour period and maintained for an additional 3 hours, followed by discharge and cooling of the resin. The thermal properties of the resins are listed in Table 1 below. A series of crystalline resins were made using this procedure and compared to various ETPA gellants as described with reference to FIG. 5.

Figure 4:
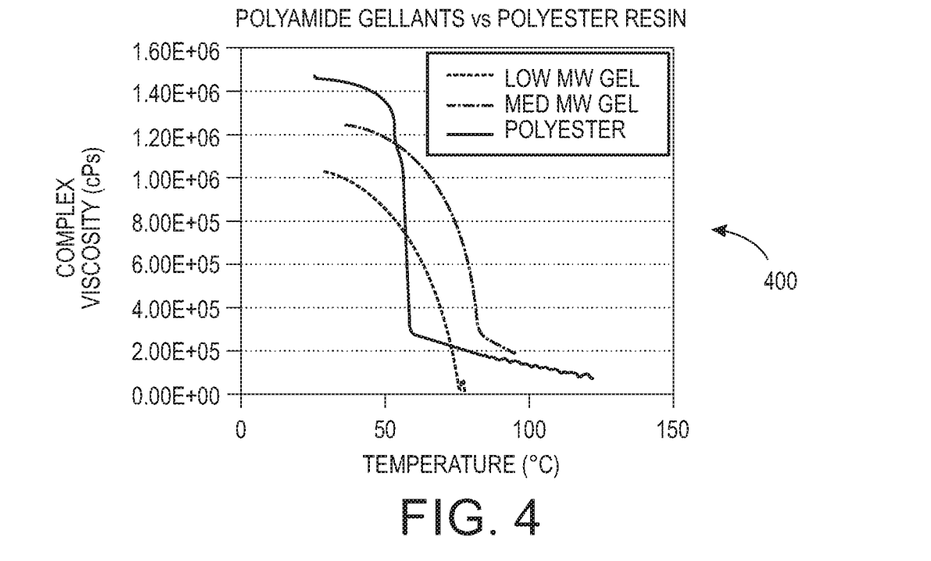
FIG. 4 illustrates a comparison of polyester viscosity modifier such as FIG. 2 and ETPA gellants such as FIG. 3 in accordance to an embodiment.

An alternate modifier or phase change additive, an ester-terminated polyamide (ETPA) gellants, is shown in FIG. 3. While ETPA gellants are successful as modifiers, the use of polyesters, such as the one highlighted in FIG. 2, can be more effective. Analysis of the viscosity characteristics of the polyester resins themselves reveals a very steep decline in viscosity as the resin is cooled from above 60° C., i.e., the first temperature, to a temperature below 25° C. as shown in FIG. 4. This is in keeping with the viscosity requirements for printing, which dictate that the transition from low viscosity (during inking), to high(er) viscosity (during transfer) occurs as rapidly as possible.

FIG. 3 illustrates the chemical Structure for an ester-terminated polyamide (ETPA) 300 gelator with an average of hydrophobic three (3) dimer tails in accordance to an embodiment. Formula II shows the structure of the ETPA gellant:

Chemical Formula: $C_{128}H_{234}N_4O_{10}$
Molecular Weight: 1989.25

FIG. 4 illustrates a comparison of polyester viscosity modifier such as FIG. 2 and ETPA gellants such as FIG. 3 in accordance to an embodiment. The comparison chart 300 shows that the gellants and polyester resin achieve a similar low viscosity profile at the inking temperature of 60° C. However, at the transfer temperature (around 25° C.) the polyester resin achieves much higher viscosity with superior switching, i.e., the resin transitions from a lower to a higher viscosity almost instantaneously.

Table 1 below illustrates a range of melting/recrystallization points that can be achieved by varying the molecular weight of the polyester. This will afford considerable latitude as the working temperatures of the print process are established.

TABLE 1

Thermal characteristics of a series of polyesters

| Resin | Type Diacid:Diol | Raw Material Cost ($/Kg) | Melting point (DSC) ° C. | Recrstalization Temperature DSC (° C.) | AV Manual | AV Auto | Mn/Mw/ 1000 |
|---|---|---|---|---|---|---|---|
| FXA006 Lot 342 | CPE 10:9 | 17.40 | 76.1 | 58.8 | — | 10.6 | 10.4/22.9 |

TABLE 1-continued

Thermal characteristics of a series of polyesters

| Resin | Type Diacid:Diol | Raw Material Cost ($/Kg) | Melting point (DSC) ° C. | Recrstalization Temperature DSC (° C.) | AV Manual | AV Auto | Mn/Mw/ 1000 |
|---|---|---|---|---|---|---|---|
| FXE001M lot R001 | CPE 10:6 | 7.85 | 76.1 | 58.8 | — | 10.4 | 10.4/20.7 |
| PP-CPE-31 | CPE 8:6 | 4.70 | 69.3 | 52 | 8.5 | 8.97 | 14/22.1 |
| GS1414 | CPE 8:4 | 4.68 | 66.5 | 44.4 | 11.1 | 11.4 | 6.8/21.2 |
| GS-HK-11 | CPE 6:6 | 3.86 | 61.2 | 43.4 | 12.4 | 12.0 | 2.3/4.1 |
| GS-HK-12 | CPE 6:4 | 3.79 | 56.5 | 32.2 | 10.7 | 9.05 | 6.9/19.6 |
| GS-HK-13 | CPE 10:4 | 7.30 | 74.8 | 59.5 | 18.6 | tbd | 7.1/22.0 |
| ZK-JG181-845 | CPE 2:6 | 1.50 | 52.4 | 57.4 | 15 | tbd | tbd |

Figure 5:
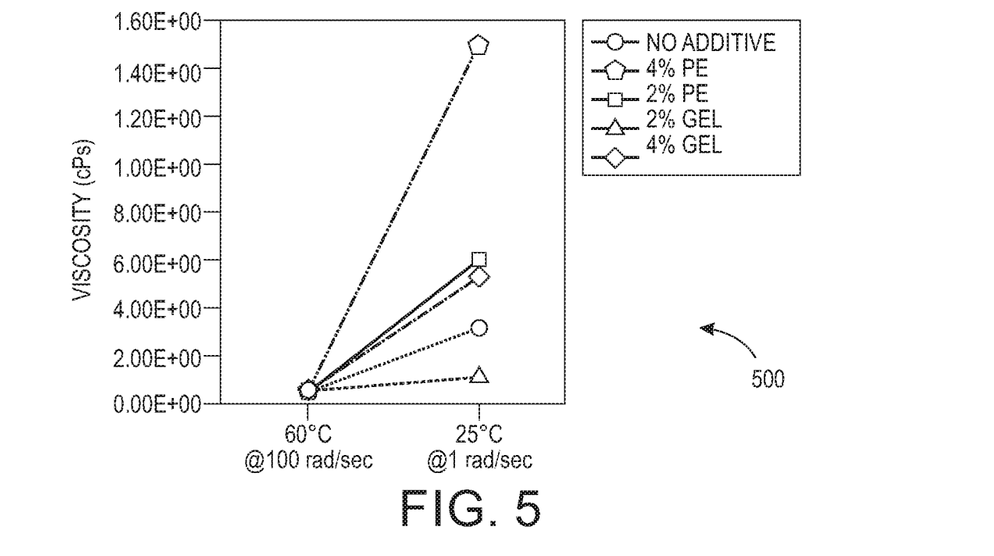
FIG. 5 illustrates rheological characteristics of inks containing no viscosity modifier, ETPA gellant, and polyester additive in accordance to an embodiment.

FIG. 5 illustrates rheological characteristics of inks containing no viscosity modifier, ETPA gellant, and polyester additive in accordance to an embodiment. The manner of preparing the various ink examples are described below. Viscosities were measured using a cone and plate viscometer at 60° C. @ 100 rad/sec and 25° C. @ 1 rad/sec, to approximate the temperatures and shearing levels encountered during inking and transfer of the ink being printed. Results were compared to inks having an equal amount of the gellant described above with reference to FIG. 3, as well as a control ink having no viscosity modifier added. All of these inks have similar viscosities at 60° C., but addition of increasing amounts of the polyester additive lead to significantly higher viscosities at 25° C., thus a wider gap between viscosities at these two temperatures can be achieved.

In addition to accounting for the above considerations in formulation, the composition must also be compatible with all aspects of the print performance. For example, ink delivery, interaction with fountain fluid and imaging on the blanket substrate, and transfer to a wide latitude of substrates (papers, plastic substrates). The end result is a digital print possessing offset lithography image quality with good curing highlighted by its resistance to solvent tests, such as MEK (methylethyl ketone) rub tests.

Ink Example 1 is a first ink set with at least one polyester viscosity modifier. Based on a 300 g total scale of preparation of the ink, the first set of ink base components (including the dispersant, monomer, oligomer, polyester additive (at a loading of 2.0 wt %) and thermal stabilizer) were added in a 1 L stainless steel vessel. The vessel was placed on a heating mantle, available from IKA® equipped with a thermocouple and stirrer apparatus also available from IKA® and with an anchor impeller. The components in the vessel were stirred at about 200 RPM for about 30 minutes at about 80° C. Then the second set of ink base components, the photoinitiators comprising one or more photoinitiators, was added slowly with stirring at about 80° C. which continued for about another hour. With the vehicle base components solubilized, the given quantity of colored pigment was added to the system where more vigorous stirring occurred but not the point where air was being entrained into the system. The pigmented mixture was allowed to stir for about 30 minutes at about 400 RPM at which point the clay was added slowly to the pigmented mixture at reduced RPM but then re-stirred for about another 15 minutes at about 400 RPM. The vessel containing the mixed components was transferred to a high speed shearing mill available from the Hockmeyer Equipment Corporation equipped with a 40 mm diameter high shear Cowles blade which was then stirred at 5300 RPM for about an hour. The thoroughly mixed component mixture was then qualitatively transferred to a 3-roll mill apparatus manufactured by Kent Machine Works where the material composite paste was passed through the 3-roll mill first at an input apron roll speed of 200 RPM for the first pass and then at an input apron roll speed of 200 RPM for the second pass.

Ink Example 2 is a second ink set with at least one polyester viscosity modifier. A magenta ink was prepared in the same manner as in ink Example 1, except that the polyester additive was used at a loading of 4.0 wt %.

Ink Example 3 is a third ink set without a polyester viscosity modifier. A magenta ink was prepared in the same manner as in ink Example 1, except that no viscosity modifiers were used.

Ink Example 4 is a fourth ink set without a polyester viscosity modifier. A magenta ink was prepared in the same manner as in ink Example 1, except that the ETPA gellant shown in FIG. 3 was used at a loading of 2.0 wt %.

Ink Example 5 is a fifth ink set without a polyester viscosity modifier. A magenta ink was prepared in the same manner as in ink Example 1, except that the ETPA gellant shown in FIG. 3 was used at a loading of 4.0 wt %.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. An ink composition for variable data lithography printing comprising:
   an ink vehicle and at least one colorant component suspended in the ink vehicle;
   the ink composition including at least one polyester viscosity modifier;
   the ink composition further comprising two or more of
   at least one dispersant;
   a thermal stabilizer; and
   a photoinitiator system;
   wherein the photoinitiator system comprises at least three or more photoinitiators at specific ratios to each other;
   wherein the at least one polyester viscosity modifier causes the ink composition for variable lithography printing to achieve a relative lower viscosity at a first temperature and a relative higher viscosity at a second temperature;
   wherein the second temperature is at a temperature range of about 15 to about 25° C.;

wherein the first temperature is a heating temperature that is higher than the second temperature;

wherein the least one polyester viscosity modifier is a crystalline polyester resin having a structure of formula I:

wherein M is a metal, and R1 and R3 is independently selected from the group consisting of aryl and alkyl; R2 is independently selected from the group consisting of alkyl and oxyalkylene, and wherein a, b, c, n and p represent random segments of the polymer; and are each about 10 to about 100,000 units.

2. The ink composition of claim 1, the the ink composition further comprising: a rheology modifying agent.

3. The ink composition of claim 2, wherein the vehicle is a radiation-curable compound that comprises monomer compounds selected from the group of compounds comprising mono-, di-, and tri-functional acrylate monomers, tetra-functional acrylates and oligomers.

4. The ink composition of claim 1, wherein the crystalline polyester resin loading is of from about 2 to about 4 weight percent based on a total weight of the ink composition.

* * * * *